United States Patent
Kretschmann et al.

(10) Patent No.: US 9,106,019 B2
(45) Date of Patent: Aug. 11, 2015

(54) INPUT/OUTPUT DEVICES HAVING RE-CONFIGURABLE FUNCTIONALITY

(75) Inventors: Robert J. Kretschmann, Bay Village, OH (US); David S. Wehrle, Chesterland, OH (US); Joseph G. Vazach, Mentor, OH (US); Gregg M. Sichner, Mentor, OH (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 193 days.

(21) Appl. No.: 13/214,035

(22) Filed: Aug. 19, 2011

(65) Prior Publication Data

US 2012/0047288 A1    Feb. 23, 2012

Related U.S. Application Data

(60) Provisional application No. 61/375,587, filed on Aug. 20, 2010.

(51) Int. Cl.
*H01R 13/629*    (2006.01)
*H01R 13/635*    (2006.01)
*H01R 13/62*    (2006.01)
*H05K 7/14*    (2006.01)

(52) U.S. Cl.
CPC .............. *H01R 13/635* (2013.01); *H01R 13/62* (2013.01); *H01R 13/629* (2013.01); *H05K 7/1468* (2013.01); *H05K 7/1484* (2013.01); *Y10T 29/49117* (2015.01)

(58) Field of Classification Search
USPC .............. 710/1, 2, 5, 8, 10, 13, 15, 16, 17, 62
See application file for complete search history.

(56) References Cited

U.S. PATENT DOCUMENTS

| 5,366,609 | A | * | 11/1994 | White et al. ............. 204/403.04 |
| 5,472,347 | A | | 12/1995 | Nordenstrom et al. |
| 6,008,985 | A | * | 12/1999 | Lake et al. ............... 361/679.32 |
| 6,175,932 | B1 | | 1/2001 | Foote et al. |

(Continued)

FOREIGN PATENT DOCUMENTS

WO    2007073228    6/2007

OTHER PUBLICATIONS

U.S. Appl. No. 13/213,996, filed Aug. 19, 2011, Molnar.

(Continued)

*Primary Examiner* — Farley Abad
(74) *Attorney, Agent, or Firm* — Fletcher Yoder, P.C.

(57) ABSTRACT

Systems and methods provide re-configurable functionality within components of I/O devices without the need of disconnecting the components from each other. For example, in certain embodiments, when certain types of components are connected to each other, certain functionality sets within the components may be activated to provide combined functionality sets between the components. The combined functionality sets may, for example, be preferred functionality sets to be used when the particular types of components are connected to each other. Furthermore, in certain embodiments, functionality activation keys may be physically inserted into (or electronically communicated to) the components of the I/O device to activate certain functionality sets within the component into which the functionality activation key is inserted (or electronically communicated to), as well as within the other components of the I/O device to which the component is connected.

27 Claims, 6 Drawing Sheets

(56) References Cited

U.S. PATENT DOCUMENTS

| | | | |
|---|---|---|---|
| 6,226,762 B1* | 5/2001 | Foote et al. | 714/48 |
| 7,350,008 B2* | 3/2008 | Borgatti et al. | 710/301 |
| 8,175,099 B2 | 5/2012 | Hodges et al. | |
| 8,275,560 B2* | 9/2012 | Radhakrishnan et al. | 702/60 |
| 8,412,269 B1* | 4/2013 | Cook | 455/557 |
| 2002/0156868 A1* | 10/2002 | Batke et al. | 709/218 |
| 2004/0025188 A1* | 2/2004 | Bertin et al. | 725/131 |
| 2005/0008386 A1* | 1/2005 | Hirano | 399/79 |
| 2006/0212634 A1* | 9/2006 | Reay et al. | 710/300 |
| 2007/0073850 A1 | 3/2007 | Callaghan et al. | |
| 2008/0114902 A1* | 5/2008 | Leong et al. | 710/8 |
| 2009/0204731 A1* | 8/2009 | Mulligan et al. | 710/20 |
| 2010/0011128 A1* | 1/2010 | Paycher et al. | 710/1 |
| 2010/0023649 A1* | 1/2010 | Choi et al. | 710/14 |
| 2010/0235614 A1 | 9/2010 | Callaghan et al. | |
| 2011/0126005 A1* | 5/2011 | Carpenter et al. | 713/158 |

OTHER PUBLICATIONS

U.S. Appl. No. 13/214,072, filed Aug. 19, 2011, Molnar.
U.S. Appl. No. 13/213,921, filed Aug. 19, 2011, Vazach.
U.S. Appl. No. 13/213,991, filed Aug. 19, 2011, Molnar.
U.S. Appl. No. 13/213,950, filed Aug. 19, 2011, Wehrle.
U.S. Appl. No. 13/214,027, filed Aug. 19, 2011, Bodmann.
Office Action & Search Report for Chinese Patent Application No. 201110245477.2 issued Dec. 2, 2013.
Second Office Action for Chinese Application No. 201110245477.2 issued Sep. 15, 2014.

* cited by examiner

INPUT/OUTPUT DEVICES HAVING RE-CONFIGURABLE FUNCTIONALITY

CROSS REFERENCE TO RELATED APPLICATIONS

This application claims priority of U.S. Provisional Patent Application No. 61/375,587, filed Aug. 20, 2010, which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, or interfacing with input/output (I/O) devices that are configured for coupling and interaction with an automation controller.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

The individual components of the I/O devices (e.g., a base, a terminal block, an I/O module, and so forth) may be removable from each other to provide modular interactivity between the components, which enables a greater degree of customization of the automation controllers in which the I/O devices are used. However, conventional components of I/O devices are configured with certain functionalities that do not change when the components of the I/O device are assembled together. Rather, to change the functionality of a given I/O device, as one example, a particular I/O module may be removed from the I/O device and replaced with a different I/O module that provides different functionality. As such, this requires removal of the components of the I/O device, which can inadvertently lead to disruptions of connections (e.g., of the field wires that connect the I/O device to a field device, of electrical connections between adjacent I/O devices, and so forth). Furthermore, certain functionality may often be preferred between I/O component combinations. For example, when a particular type of I/O module is connected to a particular type of base, a given functionality set may be particularly beneficial, whereas the same functionality set may not be as beneficial when used with a different module-base combination.

BRIEF DESCRIPTION

The present invention provides systems and methods for providing reconfigurable functionality within components of I/O devices without the need of disconnecting the components from each other. For example, in certain embodiments, when certain types of components are connected to each other, certain functionality sets within the components may be activated to provide combined functionality sets between the components. As an example, when an I/O module is inserted into a base of an I/O device, certain functionality sets within the I/O module and/or the base may be activated, whereas other functionality sets within the I/O module and/or the base are disabled, such that a combined functionality set is activated for the base/module combination. The combined functionality sets may, for example, be preferred functionality sets to be used when the particular type of I/O module and the particular type of base are connected to each other. Furthermore, in certain embodiments, functionality activation keys may be inserted into the components of the I/O device to activate certain functionality sets within the components into which the functionality activation keys are inserted, as well as within the other components of the I/O device to which the components are connected.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
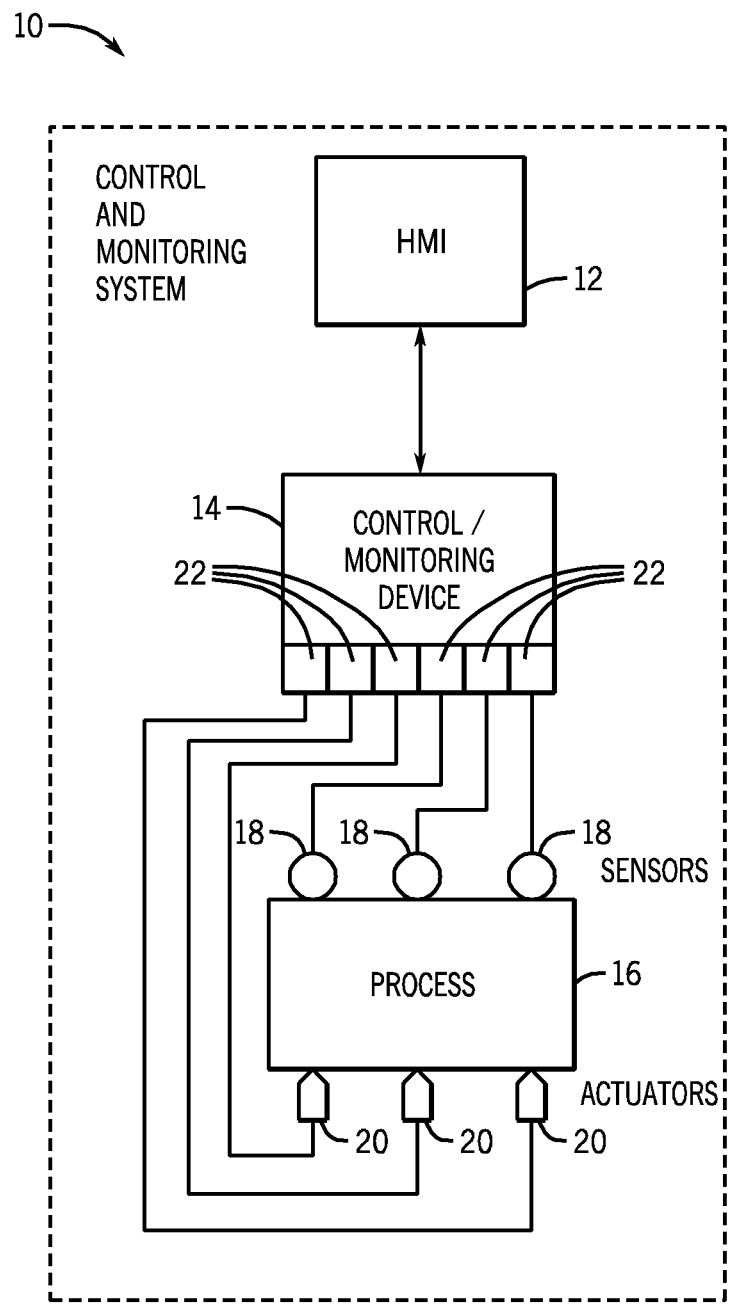
FIG. 1 is a diagrammatical representation of an exemplary control and monitoring system adapted to interface with networked components and configuration equipment in accordance with embodiments of the present techniques.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

As described in greater detail below, in certain embodiments, the I/O devices 22 may include individual components (e.g., bases, terminal blocks, I/O modules, and so forth) that include functionality sets that may be activated or disabled depending on the type of components that are connected together to form a particular I/O device 22. In addition, in certain embodiments, functionality activation keys may also be used to determine which functionality sets are activated or disabled in the components of the I/O devices 22. For example, the functionality activation keys may include physical key mechanisms (e.g., "hard keys") that may be inserted into the components of the I/O devices 22, or electronic key mechanisms (e.g., "soft keys"), such as electronic keys, that may be saved in, or otherwise communicated to, the components of the I/O devices 22.

Figure 2:
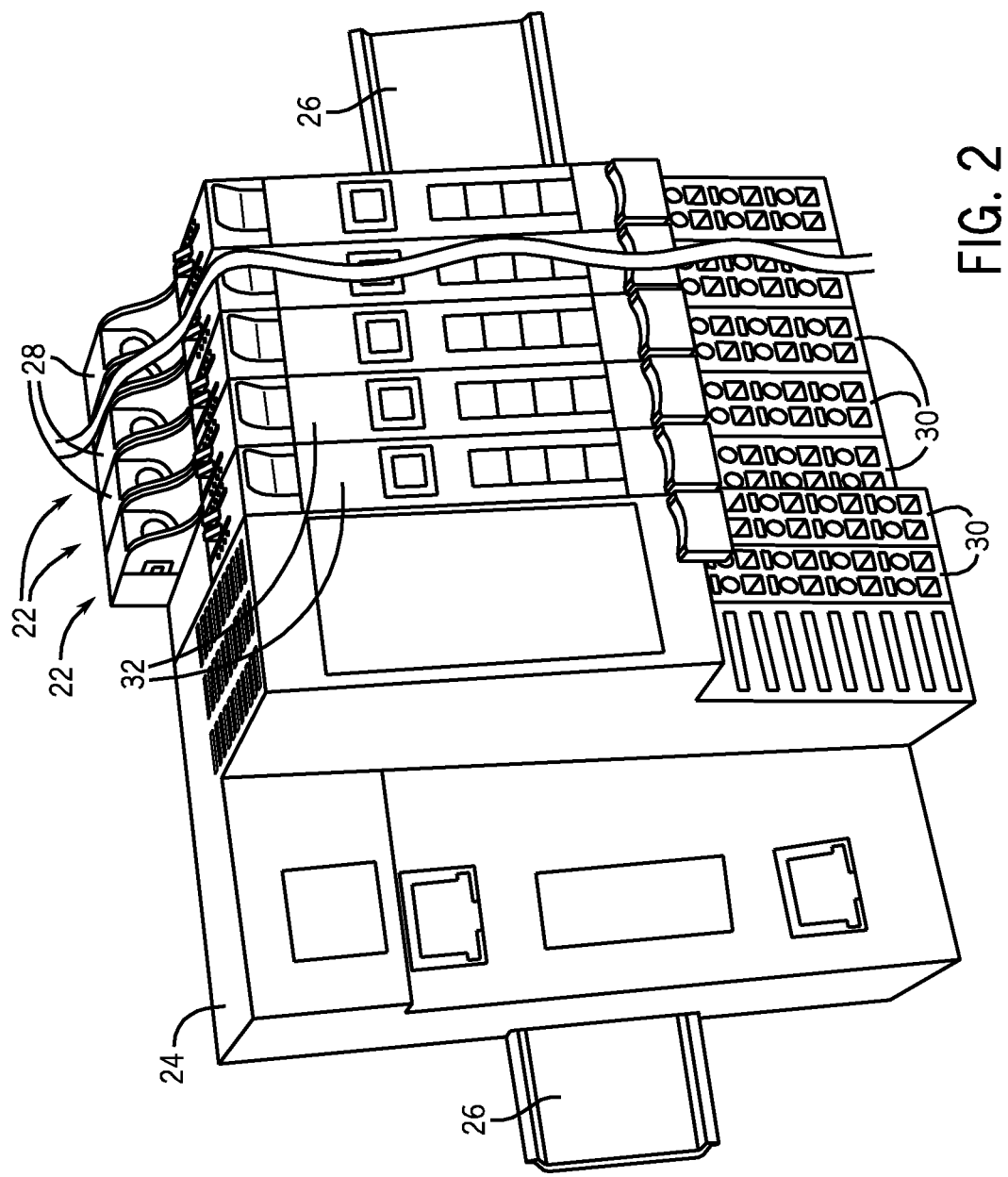
FIG. 2 is a perspective view of a plurality of I/O devices connected to an I/O adapter in accordance with embodiments of the present techniques.

FIG. 2 is a perspective view of a plurality of I/O devices 22 connected to an I/O adapter 24 in accordance with embodiments of the present techniques. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. As described in greater detail below, the plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure.

As also described in greater detail below, each of the I/O devices 22 includes a base 28 for physically and communicatively connecting the I/O device 22 to the DIN rail 26, the I/O adapter 24 and/or adjacent I/O devices 22. In addition, each of the I/O devices 22 includes a terminal block 30 (which, in certain embodiments, may be removable from the base 28) for electrically connecting the I/O device 22 to field devices, such as the sensors 18 and actuators 20 illustrated in FIG. 1. Furthermore, each of the I/O devices 22 includes one or more I/O modules 32, which include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth.

In addition, the base 28, terminal block 30, and/or I/O module 32 may include functionality sets that are activated or disabled based on the type and/or specific identification (e.g., via unique component identifier, for example) of the other components of the I/O device 22. For example, in certain embodiments, functionality sets of the I/O module 32 may be activated or disabled based on the type and/or the specific identification (i.e., as indicated by an identification mechanism) of the base 28 to which the I/O module 32 is connected and/or the type or the specific identification of the terminal block 30 to which the I/O module 32 is connected. In other embodiments, functionality sets of the terminal block 30 may be activated or disabled based on the type and/or the specific identification of the base 28 to which the terminal block 30 is connected and/or the type or the specific identification of the I/O module 32 to which the terminal block 30 is connected. In other embodiments, functionality sets of the base 28 may be activated or disabled based on the type and/or the specific identification of the I/O module 32 to which the base 28 is connected and/or the type or the specific identification of the terminal block 30 to which the base 28 is connected.

Indeed, although the embodiments described herein primarily relate to functionality sets that are activated or disabled in a particular I/O module 32 and a particular base 28 when the I/O module 32 and the base 28 are connected to each other, the present techniques may be extended to the functionality of any components of the I/O devices 22 described herein, or indeed, to any components that are connected to the I/O devices 22, such as the adapter 24, and so forth. Furthermore, in certain embodiments, functionality activation keys may be inserted into (or communicated to, in the case of electronic key mechanisms) the base 28, the terminal block 30, and/or the I/O module 32 to at least partially determine the functionality sets that are activated or disabled in the base 28, the terminal block 30, and/or the I/O module 32 of the I/O device 22.

Figure 3:
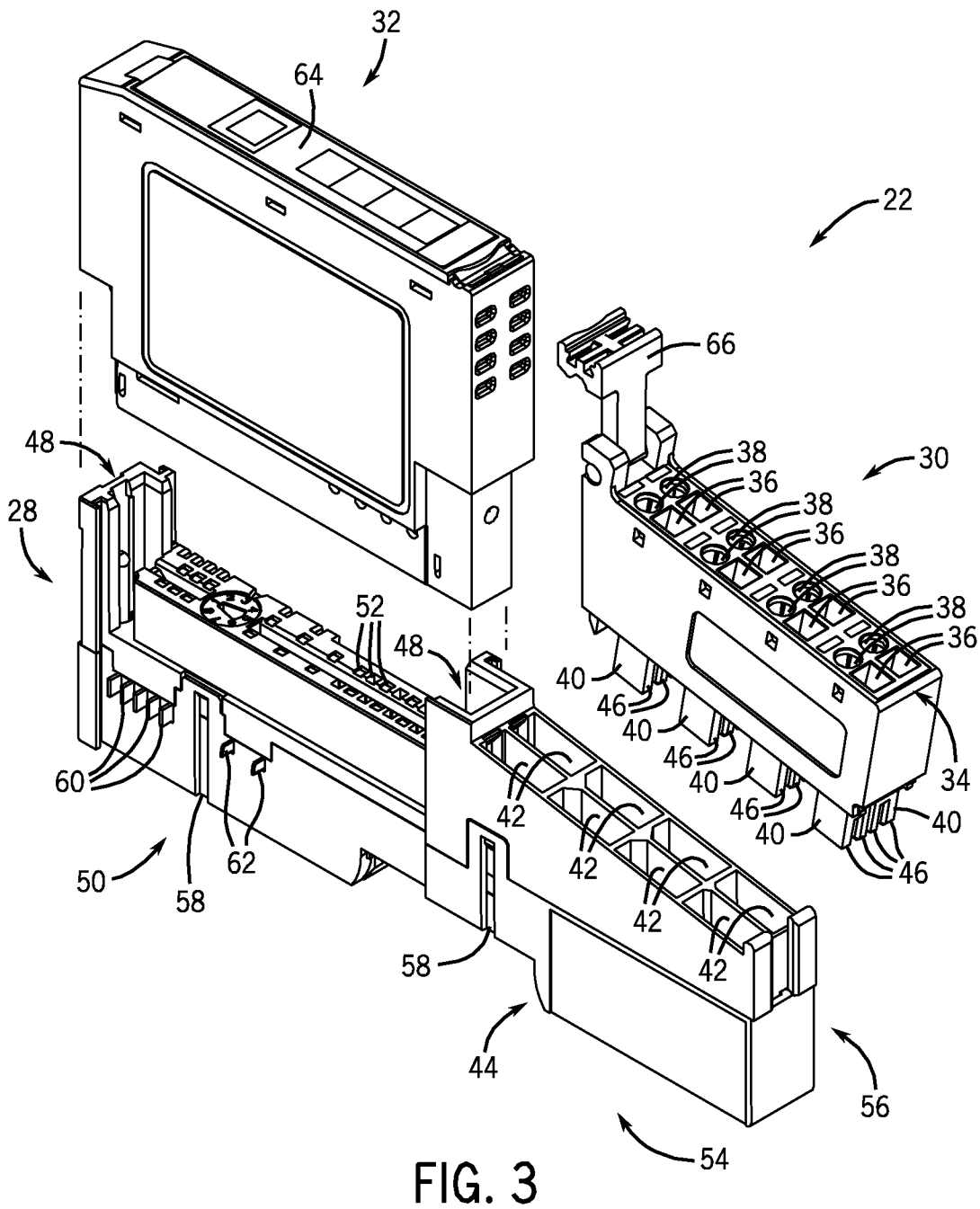
FIG. 3 is an exploded perspective view of an exemplary I/O device in accordance with embodiments of the present techniques.

FIG. 3 is an exploded perspective view of an exemplary I/O device 22 in accordance with embodiments of the present techniques. In the embodiment illustrated in FIG. 3, the terminal block 30 is a removable terminal block that may be physically connected and electrically coupled to the base 28 during assembly of the I/O device 22, and physically disconnected and electrically decoupled during disassembly (e.g., for servicing) of the I/O device 22. The removable nature of the illustrated terminal block 30 enables replacement of the I/O module 32 without the need for re-wiring. However, as described above, in other embodiments, the terminal block 30 may be directly integrated with the base 28. Such integrated embodiments may be desirable, for example, in process automation control applications for which the specific arrangement of electrical connections may be somewhat complex, and the ability to maintain these electrical connections during servicing is of greater importance.

As illustrated, the terminal block 30 includes eight terminals 34 (i.e., channels) for connecting field device wiring to the terminal block 30. Each of the terminals 34 is associated with a particular input to or output from a field device. As illustrated, each terminal 34 includes a terminal opening 36 into which a field wire electrically connected to a field device may be inserted, and an attachment activator (e.g., a terminal screw) 38, which when activated (e.g., tightened) causes a clamp or other electrical wiring connection mechanism within the terminal block 30 to tighten around an end of a field wire that has been inserted into the associated terminal opening 36. As illustrated, each of the terminals 34 terminates at the back of the terminal block 30 with a terminal block connector 40, which may be inserted into terminal block connector openings 42 in the front of a terminal block bay 44 of the base 28 to physically and communicatively connect the terminal block 30 with the base 28. In the illustrated embodiment, each of the terminal block connectors 40 include two opposing electrical prongs 46 that slide around and electrically connect with a single electrical prong (not shown) in the respective terminal block connector opening 42 of the terminal block bay 44 of the base 28. However, in other embodiments, other types of terminal block connectors 40 may be used to electrically connect with mating electrical connectors in the respective terminal block connector opening 42 of the terminal block bay 44 of the base 28.

The I/O module 32 may also be physically and communicatively connected to the base 28 by inserting the I/O module 32 into a mating slot 48 in an I/O module bay 50 of the base 28. When the I/O module 32 is inserted into the slot 48 in the I/O module bay 50 of the base 28, the I/O module 32 becomes electrically coupled to the terminals 34 of the terminal block 30 via internal circuitry within the base 28 that electrically connects the electrical prongs (or other suitable electrical connectors) in the terminal block connector openings 42 to respective electrical outlets 52 in the front of the I/O module bay 50 of the base 28. The electrical outlets 52 for each channel are in turn electrically coupled to the I/O module 32 via respective electrical connectors (not shown) that, in certain embodiments, extend from the back of the I/O module 32. As such, the terminal block 30, the base 28, and the I/O module 32 are all electrically and communicatively coupled together such that signals to and from the field device to which the I/O device 22 is connected are shared between the terminal block 30, the base 28, and the I/O module 32.

In addition, the I/O device 22 may also be electrically coupled to an I/O adapter 24 electrically upstream, and/or other I/O devices 22 electrically upstream or electrically downstream via electrical coupling features of the I/O device 22. In certain embodiments, components that are coupled electrically upstream of the I/O device 22 are components that are on a left side 54 of the I/O device 22 when viewing the I/O device 22 from the front, and components that are electrically coupled downstream of the I/O device 22 are components that are on a right side 56 of the I/O device 22 when viewing the I/O device 22 from the front. However, in other embodiments, the upstream and downstream electrical coupling features may be configured differently.

In certain embodiments, adjacent I/O devices 22 may be physically attached to each other via one or more connection features (e.g., slots) 58 of the base 28 on one of the sides (e.g., the left side 54 of the illustrated embodiment) of the I/O device 22 near the back of the base 28. Mating connection features such as protrusions (not shown) may be disposed on the opposite side (e.g., the right side 56 of the illustrated embodiment) of the base 28 of the I/O device 22 near the back of the base 28. In certain embodiments, connection features of an I/O device 22 may slide into mating connection features of an adjacent I/O device 22, thereby physically attaching the adjacent I/O devices 22.

When adjacent I/O devices 22 are physically attached to each other, system electrical contacts 60 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. Similarly, field electrical contacts 62 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. In the illustrated embodiment, the I/O device 22 includes five system electrical contacts 60 and two field electrical contacts 62. In such an embodiment, system power may be electrically communicated via electrically connected I/O devices 22 and/or the I/O adapter 24 via two of the system electrical contacts 60, while the three other system electrical contacts 60 are used for transmission of data (e.g., relating to signals transmitted to and from the field devices to which the I/O devices 22 are electrically connected) between the electrically connected I/O devices 22 and the I/O adapter 24. In addition, the two field electrical contacts 62 are used to electrically communicate power to the field devices to which the I/O devices 22 are electrically connected. However, it will be understood that the specific number of system electrical contacts 60 and field electrical contacts 62 may vary between implementations depending on the requirements for power and data transmission of the I/O devices 22.

As illustrated, in certain embodiments, the I/O module 32 may include a status display 64 on the front face of the I/O module 32 for displaying operating status information of the I/O module 32, the base 28, and the terminal block 30. The status display 64 may, for example, include status light emitting diodes (LEDs) corresponding to each of the terminals 34 of the terminal block 30. In addition, in certain embodiments, once the terminal block 30 and the I/O module 32 are physically and communicatively connected to the base 28 of the I/O device 22, a latch 66 or other fastening device extending from the terminal block 30 may further attach the terminal block 30 to the I/O module 32, thereby providing additional structural support and stabilizing the electrical connections between the terminal block 30, the I/O module 32, and the base 28.

As described above and illustrated in FIG. 3, in certain embodiments, the base 28, terminal block 30, and I/O module 32 of the I/O device 22 may be separate components that may be physically, electrically, and communicatively coupled and decoupled from each other as needed. For example, in certain embodiments where the terminal block 30 is a removable terminal block 30 as illustrated in FIG. 3, the terminal block 30 may be removed from the base 28 of the I/O device 22 to investigate connections between the base 28 and the terminal block 30 without disturbing the connection of field wires from the field device to which the I/O device 22 is connected. As another example, different I/O modules 32 may be inserted into the base 28 of the I/O device 22 to provide different levels of I/O functionality. For example, certain I/O modules 32 may provide general functionality, such as receiving signals from the field device(s) to which the I/O device 22 is connected, transmitting the received signals to an automation controller (e.g., the control/monitoring device 14 of FIG. 1), receiving control signals from the automation controller, and transmitting the control signals to the field device(s). In addition, the I/O modules 32 may be configured to perform certain general local control functions on the signals received and transmitted through the base 28.

However, other I/O modules 32 may provide more specific functionality, such as performing specialized processing operations on the signals that are received from the field device(s), the automation controller, and so forth. For example, certain I/O modules 32 may include specific software for performing specialized operations relating to particular types of equipment, particular industry applications, particular local control functions (e.g., performed within the I/O module 32), and so forth. Therefore, although the bases 28 of adjacent I/O devices 22 may remain attached to each other during operation of the I/O devices 22, the terminal blocks 30 and/or I/O modules 32 of the I/O devices 22 may often be removed and re-inserted for diagnostics and troubleshooting of one or more I/O devices 22 and/or for changing the functionality of one or more of the I/O devices 22. Indeed, this is an advantageous aspect of the modular nature of the terminal blocks 30 and the I/O modules 32 illustrated in FIGS. 2 and 3.

Furthermore, in certain embodiments, the base 28 and/or the I/O module 32 (or any component of the I/O device 22) may include certain respective functionality sets that enable the I/O device 22 to perform local processing functions (e.g., within the I/O device 22) on the input and output signals communicated between the I/O device 22 and the field device(s) to which the I/O device 22 are connected. For example, the base 28 may include a set of one or more general functions (e.g., a functionality feature) for receiving signals from the field device(s) to which the I/O device 22 is connected, identifying other I/O devices 22 that are communicatively connected to the base 28 that should be notified of the signals received from the field device(s), transmitting the received signals to an automation controller (e.g., the control/monitoring device 14 of FIG. 1) and/or other I/O devices 22, receiving control signals from the automation controller and/or other I/O devices 22, transmitting the control signals to the field device(s), and performing certain basic processing operations (e.g., signal conditioning, and so forth) on all of the signals received and transmitted through the base 28.

In contrast, the I/O module 32 may include a broader set of functions for performing local actions (e.g., local control functions) on the signals received and transmitted from the base 28 to which the I/O module 32 is physically and communicatively connected. For example, similar to the base 28, the I/O module 32 may also include a set of one or more general functions (e.g., a functionality feature) for receiving signals from the field device(s) to which the I/O device 22 is connected, identifying other I/O devices 22 that are communicatively connected to the base 28 that should be notified of the signals received from the field device(s), transmitting the received signals to an automation controller (e.g., the control/monitoring device 14 of FIG. 1) and/or other I/O devices 22, receiving control signals from the automation controller and/or other I/O devices 22, and transmitting the control signals to the field device(s).

However, in certain embodiments, the I/O module 32 may further be configured to perform more complex local control functions than the base 28. As described above, these local control functions may be somewhat general in nature, for example, local control operations that may be performed regardless of the particular types of equipment that the field devices(s) are connected to, the particular industry applications that the field device(s) are a part of, and so forth. However, the local control functions that the I/O module 32 is configured to perform may also be more specialized in nature, such as local control operations that are specific to particular types of equipment, that are specific to particular industry applications, that provide more specialized (e.g., more complex) control algorithms, and so forth.

As such, both the base 28 and the I/O module 32 are capable of providing the I/O device 22 with a variety of functionality sets (i.e. sets of functions) that can be tailored to the specific needs of the application within which the I/O device 22 is being used. Indeed, by combining a given functionality set of the base 28 with a given functionality set of the I/O module 32, a custom combined functionality set between the base 28 and the I/O module 32 may be created. One method for creating a custom combined functionality set between the base 28 and the I/O module 32, as described above, is to remove a given I/O module 32 from the base 28 and replace it with another I/O module 32 that includes a different functionality set than the I/O module 32 that was removed.

Figure 4:
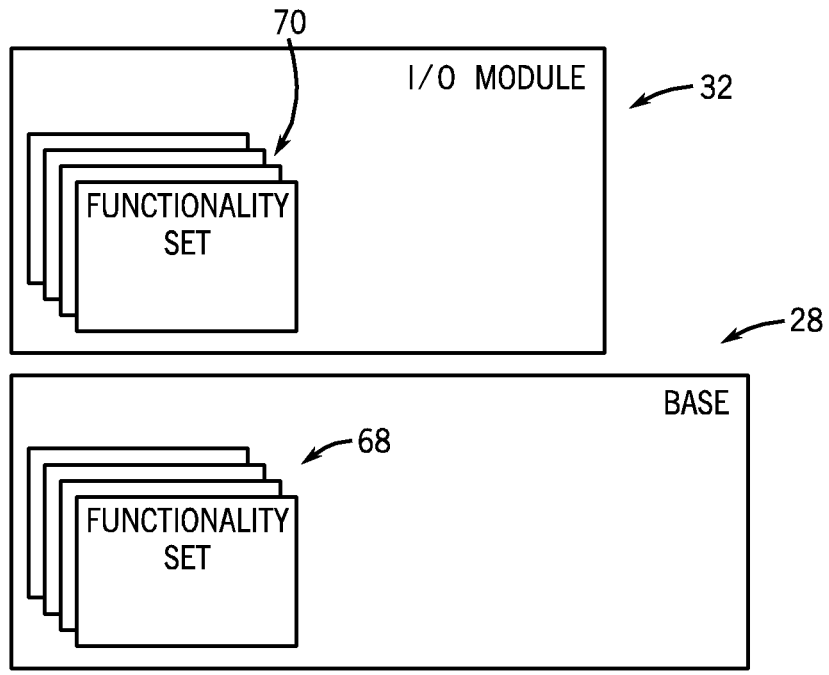
FIG. 4 is a schematic diagram of an exemplary base and I/O module, each having a respective plurality of functionality sets in accordance with embodiments of the present techniques.

However, another method for creating a custom combined functionality set between the base 28 and the I/O module 32 is to configure the base 28 and/or the I/O module 32 with a plurality of functionality sets, but only activating certain functionality sets for the base 28 and/or the I/O module 32 when a particular base 28 (e.g., based on the type of base 28 or a unique identifier of the base 28) is connected to a particular I/O module 32 (e.g., based on the type of I/O module 32 or a unique identifier of the I/O module 32). For example, FIG. 4 is a schematic diagram of an exemplary base 28 and I/O module 32, each having a respective plurality of functionality sets 68, 70 in accordance with embodiments of the present techniques. Although the base 28 and the I/O module 32 are illustrated in FIG. 4 as both including four functionality sets 68, 70, it will be understood that the base 28 and the I/O module 32 may include any number of functionality sets 68, 70.

As described in greater detail below, in certain embodiments, the base 28 is configured to activate certain functionality sets 68 based on the type and/or unique identifier of the I/O module 32 to which the base 28 is physically connected. Similarly, in certain embodiments, the I/O module 32 is configured to activate certain functionality sets 70 based on the type and/or unique identifier of the base 28 to which the I/O module 32 is connected. In other words, only certain functionality sets 68 in the base 28 may be activated when the base 28 is connected to a particular I/O module 32, whereas a different combination of functionality sets 68 in the base 28 may be activated when the base 28 is connected to a different I/O module 32. Similarly, only certain functionality sets 70 in the I/O module 32 may be activated when the I/O module 32 is connected to a particular base 28, whereas a different combination of functionality sets 70 in the I/O module 32 may be activated when the I/O module 32 is connected to a different base 28.

Therefore, any particular combination of base 28 and I/O module 32 may include a custom combined functionality set (e.g., the activated functionality sets 68 in the base 28 and the activated functionality sets 70 in the I/O module 32) when the base 28 and the I/O module 32 are connected to each other. For example, two of the functionality sets 68 in the base 28 illustrated in FIG. 4 may be activated, whereas the other two functionality sets 68 of the base 28 are disabled, and three of the functionality sets 70 of the I/O module 32 illustrated in FIG. 4 may be activated, whereas the other functionality set 70 is disabled, when the base 28 and the I/O module 32 are connected to each other.

It should be noted that, in certain embodiments, either the base 28 or the I/O module 32 may include a single functionality set that does not change based on the specific base/module combination. For example, in certain embodiments, the base 28 may include a single functionality set 68 that does not change based on the type and/or unique identifier of the I/O module 32 to which the base 28 is connected. Similarly, in certain embodiments, the I/O module 32 may include a single functionality set 70 that does not change based on the type and/or unique identifier of the base 28 to which the I/O module 32 is connected. Regardless, either the base 28 or the I/O module 32 (or both) include a plurality of functionality sets 68, 70 that may change based on the particular base/module combination.

Figure 5:
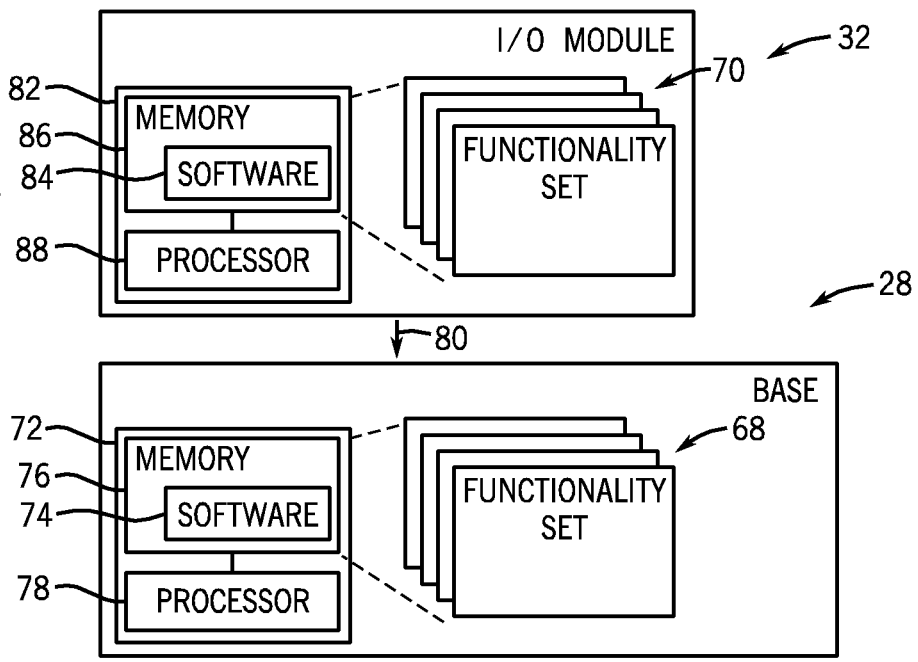
FIG. 5 is a schematic diagram of the exemplary base and I/O module of FIG. 4 being connected together in accordance with embodiments of the present techniques.

As such, in certain embodiments, merely connecting a particular base 28 to a particular I/O module 32 creates a combined functionality set of the base/module combination. For example, FIG. 5 is a schematic diagram of the exemplary base 28 and I/O module 32 of FIG. 4 being connected together in accordance with embodiments of the present techniques. As illustrated, in certain embodiments, the base 28 may include an activation feature such as base functionality activation circuitry 72 for determining which of the plurality of functionality sets 68 of the base 28 to activate and which of the plurality of functionality sets 68 of the base 28 to disable based on the type and/or unique identifier (e.g., indicated by an identification mechanism) of the I/O module 32 to which the base 28 is connected.

As illustrated, in certain embodiments, the base functionality activation circuitry 72 may include base functionality activation software 74 (e.g., computer instructions) stored on a machine-readable memory 76 of the base 28 that is configured to be executed on a processor 78 of the base 28, with the base functionality activation software 74 being configured to interrogate the I/O module 32 to which the base 28 is connected to determine the type and/or unique identifier of the I/O module 32. As illustrated, the plurality of functionality sets 68 of the base 28 may include one or more algorithms stored on the memory 76 of the base 28. In certain embodiments, the base functionality activation software 74 may electronically communicate with the I/O module 32 by, for example, transmitting signals to the I/O module 32 via electrical connections, receiving signals from the I/O module 32 relating to the type and/or unique identifier of the I/O module 32, and performing processing functions on the received signals. For example, the type and/or unique identifier of the I/O module 32 may be stored in a memory (e.g., memory 86) of the I/O module 32, such that the type and/or unique identifier of the I/O module 32 may be retrieved from the memory by the base functionality activation software 74. In addition, in certain embodiments, once the type and/or unique identifier of the I/O module 32 is retrieved by the base functionality activation software 74, the base functionality activation software 74 may use the type and/or unique identifier of the I/O module 32 to determine which functionality sets 68 should be activated and which functionality sets 68 should be disabled. For example, in certain embodiments, the base functionality activation software 74 may make this determination by looking up the information in a lookup table stored within the memory 76 of the base 28, with the lookup table being periodically updated via software updates in certain embodiments.

However, in other embodiments, the base functionality activation circuitry 72 may include hardware for mechanically determining the type and/or unique identifier of the I/O module 32 to which the base 28 is connected. For example, in certain embodiments, the base functionality activation circuitry 72 may include electrical connectors (e.g., conductive contacts) that are configured to couple with (or not couple with, as described below) electrical connectors of the I/O module 32. When the I/O module 32 is inserted into the base 28, the electrical connectors of the base functionality activation circuitry 72 may electrically connect with certain mating electrical connectors of the I/O module 32, such that certain electrical circuits between the base/module combination are completed. Depending on the type of the base 28 and the type of the I/O module 32, certain electrical connectors may or may not be physically aligned, such that only particular electrical circuits are completed between the base 28 and the I/O module 32 for the particular base/module combination. As such, in certain embodiments, only certain electrical circuits for a particular base/module combination may be completed. In certain embodiments, the electrical circuits may include hardware-based circuitry (e.g., switches, and so forth) that are configured to perform the functions of the functionality sets 68, 70, and only the hardware-based circuitry of the completed (electrically connected) electrical circuits are activated, whereas the hardware-based circuitry of the uncompleted (e.g., electrically disconnected) electrical circuits are disabled.

Moreover, other techniques for determining the type and/or unique identifier of the I/O module 32 may be used. For example, in certain embodiments, the type and/or unique identifier of the I/O module 32 may be encoded on a radio frequency identification (RFID) tag of the I/O module 32, and the type and/or unique identifier of the I/O module 32 may be interpreted via response radio waves received by a radio frequency (RF) interrogator of the base functionality activation circuitry 72, where the response waves are generated by radio waves sent from the RF interrogator. In other embodiments, the type and/or unique identifier of the I/O module 32 may be conveyed via a variable resistance value of a variable resistor stored in the I/O module 32, where the base functionality activation circuitry 72 is configured to apply a voltage across the variable resistor, and the resulting current is indicative of a value relating to the type and/or unique identifier of the I/O module 32. Other exemplary techniques for identifying the I/O module 32 are disclosed in U.S. patent application Ser. No. 13/213,921, filed Aug. 19, 2011, which is herein incorporated in its entirety by reference.

It will be understood that the hardware-based and software-based techniques described above may be combined together in certain embodiments. For example, in certain embodiments, electrical connectors between the base 28 and the I/O module 32 may complete electrical circuits that enable signals to be communicated between the base 28 and the I/O module 32. Regardless of whether software-based, hardware-based, or some combination of techniques are used, when the I/O module 32 is inserted into the base 28, as illustrated by arrow 80, the base functionality activation circuitry 72 communicates with the I/O module 32 to determine the type and/or unique identifier of the I/O module 32 that is connected to the base 28, and determine which of the plurality of functional sets 68 of the base 28 to activate and which of the plurality of functional sets 68 of the base 28 to disable based on the type and/or unique identifier of the I/O module 32 connected to the base 28.

Similarly, in certain embodiments, the I/O module 32 may include I/O module functionality activation circuitry 82 (e.g., an activation feature) for determining which of the plurality of functionality sets 70 of the I/O module 32 to activate and which of the plurality of functionality sets 70 of the I/O module 32 to disable based on the type and/or unique identifier (e.g., as indicated by an identification mechanism) of the base 28 to which the I/O module 32 is connected.

As illustrated, in certain embodiments, the I/O module functionality activation circuitry 82 may include I/O module functionality activation software 84 (e.g., computer instructions) stored on a machine-readable memory 86 of the I/O module 32 that is configured to be executed on a processor 88 of the I/O module 32, with the I/O module functionality activation software 84 being configured to interrogate the base 28 to which the I/O module 32 is connected to determine the type and/or unique identifier of the base 28. As illustrated, the plurality of functionality sets 70 of the I/O module 32 may include one or more algorithms on the memory 86 of the I/O module 32. In certain embodiments, the I/O module functionality activation software 84 may electronically communicate with the base 28 by, for example, transmitting signals to the base 28 via electrical connections, receiving signals from the base 28 relating to the type and/or unique identifier of the base 28, and performing processing functions on the received signals. For example, the type and/or unique identifier of the base 28 may be stored in a memory (e.g., memory 76) of the base 28, such that the type and/or unique identifier of the base 28 may be retrieved from the memory by the I/O module functionality activation software 84. In addition, in certain embodiments, once the type and/or unique identifier of the base 28 is retrieved by the I/O module functionality activation software 84, the I/O module functionality activation software 84 may use the type and/or unique identifier of the base 28 to determine which functionality sets 70 should be activated and which functionality sets 70 should be disabled. For example, in certain embodiments, the I/O module functionality activation software 84 may make this determination by looking up the information in a lookup table stored within the memory 86 of the I/O module 32, with the lookup table being periodically updated via software updates in certain embodiments.

However, in other embodiments, the I/O module functionality activation circuitry 82 may include hardware for mechanically determining the type and/or unique identifier of the base 28 to which the I/O module 32 is connected. For example, in certain embodiments, the I/O module functionality activation circuitry 82 may include electrical connectors (e.g., conductive contacts) that are configured to couple with (or not couple with, as described below) electrical connectors of the base 28. When the I/O module 32 is inserted into the base 28, the electrical connectors of the I/O module functionality activation circuitry 82 may electrically connect with certain mating electrical connectors of the base 28, such that certain electrical circuits between the base/module combination are completed. Depending on the type of the base 28 and the type of the I/O module 32, certain electrical connectors may or may not be physically aligned, such that only particular electrical circuits are completed between the base 28 and the I/O module 32 for the particular base/module combination. As such, in certain embodiments, only certain electrical circuits for a particular base/module combination may be completed. In certain embodiments, the electrical circuits may include hardware-based circuitry (e.g., switches, and so forth) that are configured to perform the functions of the functionality sets 68, 70, and only the hardware-based circuitry of the completed (electrically connected) electrical circuits are activated, whereas the hardware-based circuitry of the uncompleted (e.g., electrically disconnected) electrical circuits are disabled.

Moreover, other techniques for determining the type and/or unique identifier of the base 28 may be used. For example, in certain embodiments, the type and/or unique identifier of the base 28 may be encoded on an RFID tag of the base 28, and the type and/or unique identifier of the base 28 may be interpreted via response radio waves received by an RF interrogator of the I/O module functionality activation circuitry 82, where the response waves are generated by radio waves sent from the RF interrogator. In other embodiments, the type and/or unique identifier of the base 28 may be conveyed via a variable resistance value of a variable resistor stored in the base 28, where the I/O module functionality activation circuitry 82 is configured to apply a voltage across the variable resistor, and the resulting current is indicative of a value relating to the type and/or unique identifier of the base 28. Other exemplary techniques for identifying the base 28 are disclosed in U.S. patent application Ser. No. 13/213,921, filed Aug. 19, 2011, which is herein incorporated in its entirety by reference.

Again, it will be understood that the hardware-based and software-based techniques described above may be combined together in certain embodiments. For example, in certain embodiments, electrical connectors between the base 28 and the I/O module 32 may complete electrical circuits that enable signals to be communicated between the base 28 and the I/O module 32. Regardless of whether software-based, hardware-based, or some combination of techniques are used, when the I/O module 32 is inserted into the base 28, as illustrated by arrow 80, the I/O module functionality activation circuitry 82 communicates with the base 28 to determine the type and/or unique identifier of the base 28 that is connected to the I/O module 32, and determine which of the plurality of functional sets 70 of the I/O module 32 to activate and which of the plurality of functional sets 70 of the I/O module 32 to disable based on the type and/or unique identifier of the base 28 connected to the I/O module 32.

In certain embodiments, only the base 28 may include the base functionality activation circuitry 72 or only the I/O module 32 may include the I/O module functionality activation circuitry 82. For example, in certain embodiments, the base 28 includes the base functionality activation circuitry 72, whereas the I/O module 32 does not include the I/O module functionality activation circuitry 82. In such an embodiment, after determining the type of base/module combination, the base functionality activation circuitry 72 may determine both the functionality sets 68 of the base 28 that are activated or disabled, as well as the functionality sets 70 of the I/O module 32 that are activated or disabled. Conversely, in other embodiments, the I/O module 32 includes the I/O module functionality activation circuitry 82, whereas the base 28 does not include the base functionality activation circuitry 72. In such an embodiment, after determining the type of base/module combination, the I/O module functionality activation circuitry 82 may determine both the functionality sets 70 of the I/O module 32 that are activated or disabled, as well as the functionality sets 68 of the base 28 that are activated or disabled.

Figure 6:
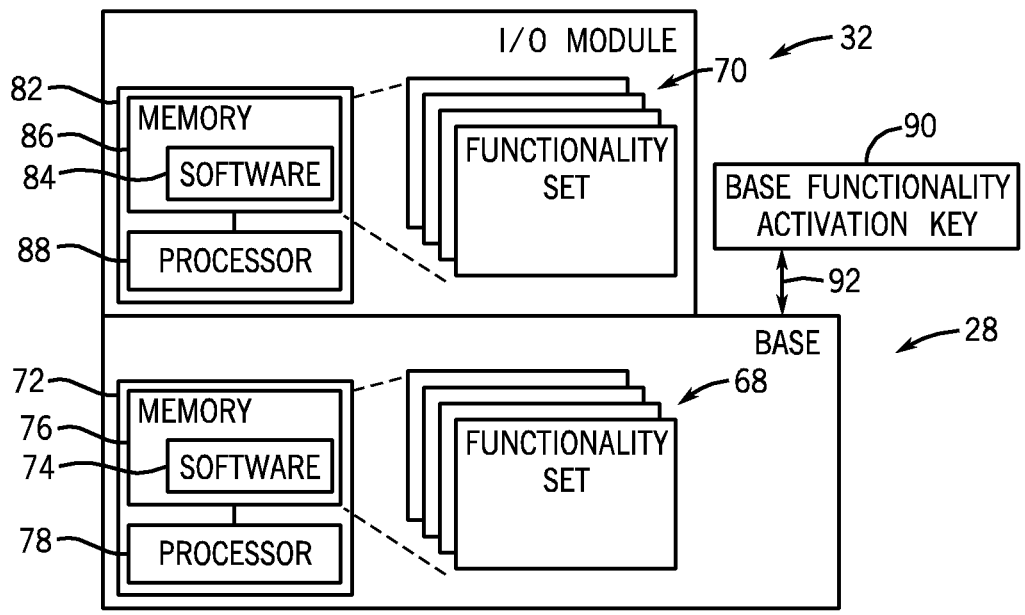
FIG. 6 is a schematic diagram of the exemplary base and I/O module of FIG. 5 using a base functionality activation key in accordance with embodiments of the present techniques.

In addition, in certain embodiments, functionality activation keys may be used to at least partially determine which functionality sets 68, 70 of the base 28 and I/O module 32 are activated or disabled. For example, FIG. 6 is a schematic diagram of the exemplary base 28 and I/O module 32 of FIG. 5 using a base functionality activation key 90 in accordance with embodiments of the present techniques. In certain embodiments, the base functionality activation key 90 may be software-based (e.g., including computer instructions encoded on a local memory), whereas in other embodiments, the base functionality activation key 90 may be hardware-based (e.g., including a mechanical feature that connects to the base functionality activation circuitry 72). It will be understood that the base functionality activation circuitry 72 may communicate with the base functionality activation key 90 using similar techniques as the hardware-based techniques, software-based techniques, or a combination thereof, described above with respect to the communication between the base 28 and the I/O module 32. As illustrated, in certain embodiments, the base functionality activation key 90 may be a physical key (e.g., a "hard key") that may be physically inserted into and ejected from the base 28, as illustrated by arrows 92. In such an embodiment, if no base functionality activation key 90 is inserted in the base 28, the base functionality activation circuitry 72 may simply function as described above.

However, although illustrated as a physical key that may be physically inserted into the base 28, in other embodiments, the base functionality activation key 90 may be an electronic key (e.g., a "soft key") that may be electronically communicated to the base functionality activation circuitry 72. For example, in certain embodiments, the electronic base functionality activation key 90 may be downloaded into the base functionality activation circuitry 72. In other embodiments, the electronic base functionality activation key 90 may be stored in another device of the control and monitoring system 10 (e.g., an HMI 12, an automation controller or control/monitoring device 14, and so forth), and the base functionality activation circuitry 72 may communicate with the other device to determine the contents of the electronic base functionality activation key 90. For example, in certain embodiments, the base functionality activation circuitry 72 may communicate with the other device to verify that the electronic base functionality activation key 90 exists, and determine how to respond to the information contained in the electronic base functionality activation key 90, without storing the electronic base functionality activation key 90 locally in the base 28. The ability to communicate the base functionality activation key 90 electronically reduces the need for hardware changes that might otherwise disrupt wiring, and so forth. Furthermore, using electronic base functionality activation keys 90 may prove particularly beneficial in scenarios where the base 28 and the I/O module 32 are integrated in a single component insofar as the electronic base functionality activation keys 90 facilitate functionality changes even though the hardware remains unchanged (e.g., remains integrated).

In certain embodiments, the base functionality activation key 90 is solely responsible for determining which functionality sets 68, 70 of the base 28 and I/O module 32 are activated or disabled. In other words, in such an embodiment, when the base functionality activation key 90 is inserted into (or communicated to, in the case of an electronic base functionality activation key 90) the base 28, no determination is made as to the type of base/module combination that is established. Rather, when the base functionality activation key 90 is inserted into (or communicated to, in the case of an electronic base functionality activation key 90) the base 28, the base functionality activation key 90 communicates with the base functionality activation circuitry 72 as to which functionality sets 68, 70 of the base 28 and I/O module 32 should be activated and which of the functionality sets 68, 70 of the base 28 and I/O module 32 should be disabled.

In other embodiments, the base functionality activation key 90 determines which of the functionality sets 68 of the base 28 are activated or disabled regardless of the type of base/module combination that is established, whereas the base functionality activation key 90 does not affect the functionality sets 70 of the I/O module 32 that are activated or disabled. In such an embodiment, the I/O module functionality activation circuitry 82 may determine the functionality sets 70 of the I/O module 32 that are activated or disabled in any fashion described above (e.g., depending on the type of base/module combination that is established, and so forth) regardless of the base functionality activation key 90. However, in other embodiments, the base functionality activation key 90 may affect the selection of the functionality sets 70 of the I/O module 32 to a certain degree. For example, the I/O module functionality activation circuitry 82 may first determine the type of base/module combination that is established, and then slightly modify the functionality sets 70 of the I/O module 32 that are activated or disabled based on the functionality sets 68 of the base 28 that are activated or disabled by the base functionality activation key 90.

Furthermore, in other embodiments, the base functionality activation key 90 may be used to supplement the combined functionality set that is established based on the techniques described above. For example, in such an embodiment, the functionality sets 68, 70 of both the base 28 and the I/O module 32 may be determined based on the type of base/module combination that is established, and the base functionality activation key 90 may be used to activate additional functionality sets 68, 70 of the base 28 and/or I/O module 32 that might not otherwise be activated. Indeed, in certain embodiments, the base functionality activation key 90 may include additional functionality sets (e.g., in the form of computer instructions encoded on a local memory of the base functionality activation key 90, a series of electrical circuits that may be completed between the base 28 and the base functionality activation key 90, and so forth) that may supplement the functionality sets 68, 70 that are activated based on the specific combination of base 28 and I/O module 32 to create an enhanced combined functionality set between the base 28 and the I/O module 32.

Figure 7:
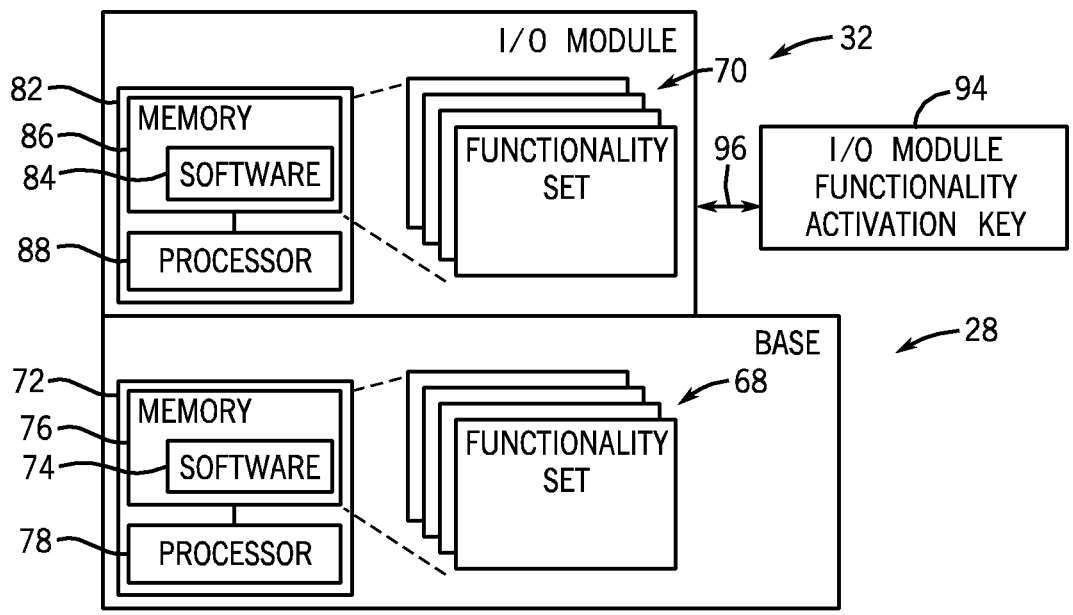
FIG. 7 is a schematic diagram of the exemplary base and I/O module of FIG. 5 using an I/O module functionality activation key in accordance with embodiments of the present techniques.

In addition, in certain embodiments, the I/O module 32 may similarly include an I/O module functionality activation key. For example, FIG. 7 is a schematic diagram of the exemplary base 28 and I/O module 32 of FIG. 5 using an I/O module functionality activation key 94 in accordance with embodiments of the present techniques. In certain embodiments, the I/O module functionality activation key 94 may be software-based (e.g., including computer instructions encoded on a local memory), whereas in other embodiments, the I/O module functionality activation key 94 may be hardware-based (e.g., including a mechanical feature that connects to the I/O module functionality activation circuitry 82). It will be understood that the I/O module functionality activation circuitry 82 may communicate with the I/O module functionality activation key 94 using similar techniques as the hardware-based techniques, software-based techniques, or a combination thereof, described above with respect to the communication between the base 28 and the I/O module 32. As illustrated, in certain embodiments, the I/O module functionality activation key 94 may be a physical key (e.g., a "hard key") that may be physically inserted into and ejected from the I/O module 32, as illustrated by arrows 96. In such an embodiment, if no I/O module functionality activation key 94 is inserted in the I/O module 32, the I/O module functionality activation circuitry 82 may simply function as described above.

However, although illustrated as a physical key that may be physically inserted into the I/O module 32, in other embodiments, the I/O module functionality activation key 94 may be an electronic key (e.g., a "soft key") that may be electronically communicated to the I/O module functionality activation circuitry 82. For example, in certain embodiments, the electronic I/O module functionality activation key 94 may be downloaded into the I/O module functionality activation circuitry 82. In other embodiments, the electronic I/O module functionality activation key 94 may be stored in another device of the control and monitoring system 10 (e.g., an HMI 12, an automation controller or control/monitoring device 14, and so forth), and the I/O module functionality activation circuitry 82 may communicate with the other device to determine the contents of the electronic I/O module functionality activation key 94. For example, in certain embodiments, the I/O module functionality activation circuitry 82 may communicate with the other device to verify that the electronic I/O module functionality activation key 94 exists, and determine how to respond to the information contained in the electronic I/O module functionality activation key 94, without storing the electronic I/O module functionality activation key 94 locally in the I/O module 32. The ability to communicate the I/O module functionality activation key 94 electronically reduces the need for hardware changes that might otherwise disrupt wiring, and so forth. Furthermore, using electronic I/O module functionality activation keys 94 may prove particularly beneficial in scenarios where the base 28 and the I/O module 32 are integrated in a single component insofar as the electronic I/O module functionality activation keys 94 facilitate functionality changes even though the hardware remains unchanged (e.g., remains integrated).

In certain embodiments, the I/O module functionality activation key 94 is solely responsible for determining which functionality sets 68, 70 of the base 28 and I/O module 32 are activated or disabled. In other words, in such an embodiment, when the I/O module functionality activation key 94 is inserted into (or communicated to, in the case of an electronic I/O module functionality activation key 94) the I/O module 32, no determination is made as to the type of base/module combination that is established. Rather, when the I/O module functionality activation key 94 is inserted into (or communicated to, in the case of an electronic I/O module functionality activation key 94) the I/O module 32, the I/O module functionality activation key 94 communicates with the I/O module functionality activation circuitry 82 as to which functionality sets 68, 70 of the base 28 and I/O module 32 should be activated and which of the functionality sets 68, 70 of the base 28 and I/O module 32 should be disabled.

In other embodiments, the I/O module functionality activation key 94 determines which of the functionality sets 70 of the I/O module 32 are activated or disabled regardless of the type of base/module combination that is established, whereas the I/O module functionality activation key 94 does not affect the functionality sets 68 of the base 28 that are activated or disabled. In such an embodiment, the base functionality activation circuitry 72 may determine the functionality sets 68 of the base 28 that are activated or disabled in any fashion described above (e.g., depending on the type of base/module combination that is established, and so forth) regardless of the I/O module functionality activation key 94. However, in other embodiments, the I/O module functionality activation key 94 may affect the selection of the functionality sets 68 of the base 28 to a certain degree. For example, the base functionality activation circuitry 72 may first determine the type of base/module combination that is established, and then slightly modify the functionality sets 68 of the base 28 that are activated or disabled based on the functionality sets 70 of the I/O module 32 that are activated or disabled by the I/O module functionality activation key 94.

Furthermore, in other embodiments, the I/O module functionality activation key 94 may be used to supplement the combined functionality set that is established based on the techniques described above. For example, in such an embodiment, the functionality sets 68, 70 of both the base 28 and the I/O module 32 may be determined based on the type of base/module combination that is established, and the I/O module functionality activation key 94 may be used to activate additional functionality sets 68, 70 of the base 28 and/or I/O module 32 that might not otherwise be activated. Indeed, in certain embodiments, the I/O module functionality activation key 94 may include additional functionality sets (e.g., in the form of computer instructions encoded on a local memory of the I/O module functionality activation key 94, a series of electrical circuits that may be completed between the I/O module 32 and the I/O module functionality activation key 94, and so forth) that may be read into the memories 76, 86 of the base 28 and/or I/O module 32 and used to supplement the functionality sets 68, 70 that are activated based on the specific combination of base 28 and I/O module 32 to create an enhanced combined functionality set between the base 28 and the I/O module 32.

Moreover, in certain embodiments, the base functionality activation key 90 illustrated in FIG. 6 and the I/O module functionality activation key 94 illustrated in FIG. 7 may be used together. In such an embodiment, the base functionality activation key 90 may generally be responsible for determining the functionality sets 68 of the base 28 that are activated or disabled, as described above with respect to FIG. 6, whereas the I/O module functionality activation key 94 may generally be responsible for determining the functionality sets 70 of the I/O module 32 that are activated or disabled. For example, the base functionality activation key 90 may either be solely responsible for determining the active functionality sets 68 of the base 28, or may supplement the active functionality sets 68 of the base 28 that are determined based on the specific base/module combination. Similarly, the I/O module functionality activation key 94 may either be solely responsible for determining the active functionality sets 70 of the I/O module 32 or may supplement the active functionality sets 70 of the I/O module 32 that are determined based on the specific base/module combination.

Figure 8:
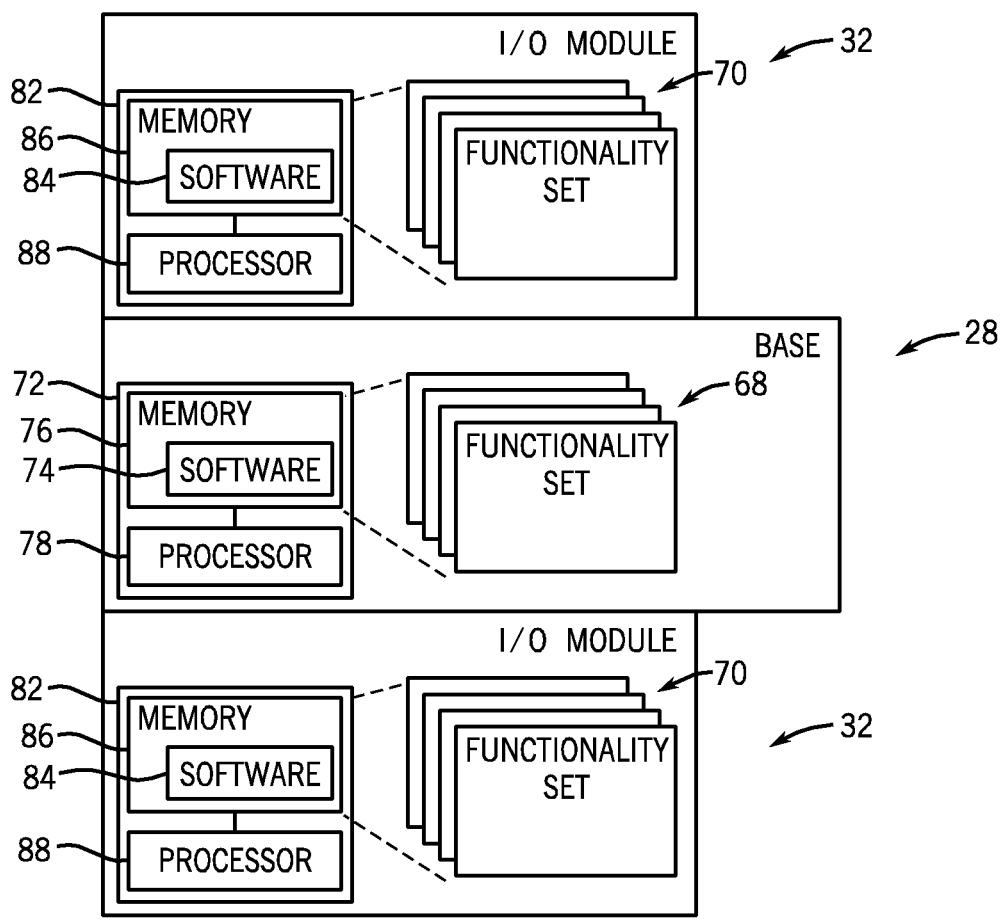
FIG. 8 is a schematic diagram of an exemplary base connected to a plurality of exemplary I/O modules in accordance with embodiments of the present techniques.

Each of the embodiments described above include a single base 28 that is paired with a single I/O module 32. However, in other embodiments, a single base 28 may include a plurality of I/O modules 32. For example, FIG. 8 is a schematic diagram of an exemplary base 28 connected to a plurality of exemplary I/O modules 32 in accordance with embodiments of the present techniques. Although illustrated as being connected to two I/O modules 32, it will be understood that the base 28 may be connected to any number of I/O modules 32. As described above, the functionality sets 68 of the base 28 that are activated or disabled may be determined by the types or unique identifiers of the I/O modules 32 that are connected to the base 28. In other words, the base functionality activation circuitry 72 functions in the same manner as described above. However, the base functionality activation circuitry 72 determines the types or unique identifiers of all (e.g., not just one) of the I/O modules 32 that are connected to the base 28 to determine which functionality sets 68 of the base 28 should be activated or disabled.

In addition, because the I/O modules 32 are still only connected to one base 28, the I/O module functionality activation circuitry 82 functions in the same manner as described above. However, in addition, the functionality sets 70 of the two I/O modules 32 may also be at least partially influenced by the type and/or unique identifier of the other I/O module 32. Furthermore, it will be understood that the functionality activation keys 90, 94 described above may also be used with the embodiment illustrated in FIG. 8 in a similar manner. As such, any particular combination (e.g., having any numerical combinations) of bases 28 and I/O modules 32 (and associated functionality activation keys 90, 94) may lead to a combined functionality set. For example, the combined functionality set of the embodiment illustrated in FIG. 8 will include the active functionality sets 68 of the base 28 and all of the active functionality sets 70 of the two I/O modules 32 that are connected to the base 28. In other words, as described herein, when multiple bases 28, multiple I/O modules 32, and/or multiple functionality activation keys 90, 94 are assembled together, unique combined functionality sets for the base/module/key combination may be achieved.

In addition, again, the techniques described herein may be extended to any components (e.g., bases 28, terminal blocks 30, I/O modules 32, and so forth) of the I/O devices 22. For example, in one particular embodiment, when a particular removable terminal block 30 is inserted into a particular base 28, certain electrical connectors such as conductive contacts may physically align and complete electrical circuits between the base 28 and the removable terminal block 30, thereby activating a compatibility of the removable terminal block 30 with certain types of equipment (e.g., temperature transducers, pressure transducers, and so forth). In other words, the techniques described herein may enable specific, customizable combined functionality sets between coupled components of I/O devices 22 that are repeatable and predictable, without the need to replace components within other components that include the desired functionalities.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A system, comprising:
an industrial automation controller, comprising:
an input/output (I/O) module of the industrial automation controller;
a functionality feature of the I/O module, wherein the functionality feature is configured to perform one or more specific functions, locally within the I/O module, on signals communicated through a base portion of an I/O device of the industrial automation controller to which the I/O module is physically and communicatively coupled and to provide an output to one or more process control field devices coupled to the industrial automation controller based on the signals, wherein the base portion comprises a mating slot configured to receive the I/O module, wherein the mating slot comprises a plurality of electrical outlets configured to electrically couple the I/O module to the base portion, wherein the I/O module comprises a plurality of electrical connectors, wherein a first subset of the plurality of electrical connectors is configured to electrically couple to a first subset of the plurality of electrical outlets to complete a first circuit, wherein a second subset of the plurality of electrical connectors is configured to electrically couple to a second subset of the plurality of electrical outlets to complete a second circuit, and wherein the first circuit is distinct from the second circuit; and
an activation feature of the I/O module, wherein the activation feature is configured to activate or disable the functionality feature based on an identification mechanism of the base portion.

2. The system of claim 1, wherein the functionality feature comprises one or more algorithms stored on a memory of the I/O module, and wherein the one or more algorithms include machine-readable instructions for performing the one or more specific functions.

3. The system of claim 2, wherein the activation feature comprises activation software for determining whether to activate or disable the functionality feature based on the identification mechanism.

4. The system of claim 1, wherein the functionality feature comprises circuitry configured to perform one or more of the specific functions when the circuitry is communicatively completed by the activation feature, wherein the activation feature comprises a switch configured to be activated by coupling with the base portion.

5. The system of claim 1, wherein the activation feature is configured to activate or disable a functionality feature of the base portion.

6. The system of claim 1, wherein the activation feature is configured to activate or disable the functionality feature based on a key that is physically inserted into the I/O module.

7. The system of claim 6, wherein the key comprises an additional functionality feature to be activated for the I/O module.

8. The system of claim 1, wherein the activation feature is configured to activate or disable the functionality feature based on a key that is electronically communicated to the I/O module.

9. The system of claim 1, comprising a set of functions of the I/O module that include the functionality feature, and wherein the activation feature of the I/O module is configured to activate or disable one or more of the set of functions of the I/O module based on the identification mechanism of the base portion.

10. A system, comprising:
an industrial automation controller, comprising:
a base portion of an input/output (I/O) device of the industrial automation controller;
a functionality feature of the base portion, wherein the functionality feature is configured to perform one or more specific functions, locally within the base portion, on signals communicated through the base portion and to provide an output to one or more process control field devices coupled to the industrial automation controller based on the signals, wherein the base portion comprises a mating slot configured to receive an I/O module, wherein the mating slot comprises a plurality of electrical outlets configured to electrically couple the I/O module to the base portion, wherein the I/O module comprises a plurality of electrical connectors, wherein a first subset of the plurality of electrical connectors is configured to electrically couple to a first subset of the plurality of electrical outlets to complete a first circuit, wherein a second subset of the plurality of electrical connectors is configured to electrically couple to a second subset of the plurality of electrical outlets to complete a second circuit, and wherein the first circuit is distinct from the second circuit; and
an activation feature of the base portion, wherein the activation feature is configured to activate or disable the functionality feature based on an identification mechanism of the I/O module that is physically and communicatively coupled to the base portion.

11. The system of claim 10, wherein the functionality feature comprises one or more algorithms stored on a memory of the base portion, and wherein the one or more algorithms include machine-readable instructions for performing the one or more specific functions.

12. The system of claim 11, wherein the activation feature comprises activation software for determining whether to activate or disable the functionality feature based on the identification mechanism.

13. The system of claim 10, wherein the functionality feature comprises circuitry configured to perform one or more of the specific functions when the circuitry is communicatively completed by the activation feature, wherein the activation feature comprises a switch configured to be activated by coupling with the I/O module.

14. The system of claim 10, wherein the activation feature is configured to activate or disable a functionality feature of the I/O module.

15. The system of claim 10, wherein the activation feature is configured to activate or disable the functionality feature based on a key that is physically inserted into the base portion.

16. The system of claim 15, wherein the key comprises an additional functionality feature to be activated for the base portion.

17. The system of claim 10, wherein the activation feature is configured to activate or disable the functionality feature based on a key that is electronically communicated to the base portion.

18. A system, comprising:
a first I/O device component of an industrial automation control system, wherein the first I/O device component comprises a first functionality feature configured to perform one or more specific functions locally within the first I/O device component, and wherein the first I/O device component is configured to receive inputs from and transmit outputs to a first plurality of process control field devices coupled to the industrial automation control system; and
a second I/O device component of the industrial automation control system, wherein the second I/O device component comprises a second functionality feature configured to perform one or more specific functions locally within the second I/O device component, and wherein the second I/O device component is configured to receive inputs from and transmit outputs to a second plurality of process control field devices;
wherein the first and second functionality features are activated or disabled based on identification mechanisms of the first and second I/O device components, wherein the first I/O device component comprises a mating slot configured to receive the second I/O device component, wherein the mating slot comprises a plurality of electrical outlets configured to electrically couple the second I/O device component to the first I/O device component, wherein the second I/O device component comprises a plurality of electrical connectors, wherein a first subset of the plurality of electrical connectors is configured to electrically couple to a first subset of the plurality of electrical outlets to complete a first circuit, wherein a second subset of the plurality of electrical connectors is configured to electrically couple to a second subset of the plurality of electrical outlets to complete a second circuit, and wherein the first circuit is distinct from the second circuit.

19. The system of claim 18, wherein each of the first and second functionality features comprise one or more algorithms stored on a memory, and wherein the one or more algorithms include machine-readable instructions for performing the one or more specific functions.

20. The system of claim 18, wherein each of the first and second functionality features comprise circuitry configured to perform one or more of the specific functions when the circuitry is communicatively completed by an activation feature, wherein the activation feature comprises a switch configured to be activated by coupling between the first and second I/O device components.

21. The system of claim 20, wherein the activation feature comprises a first conductive connector of the first I/O device component, which is configured to couple with a second conductive connector of the second I/O device component.

22. The system of claim 18, wherein an activation feature of the first I/O device component is configured to activate or disable the first and second functionality features based on the identification mechanisms.

23. The system of claim 18, wherein a first activation feature of the first I/O device component is configured to activate or disable the first functionality feature based on an identification mechanism of the second I/O device component, and a second activation feature of the second I/O device component is configured to activate or disable the second functionality feature based on an identification mechanism of the first I/O device component.

24. The system of claim 18, comprising a key configured to be physically inserted into the first I/O device component, wherein the first and second functionality features are activated or disabled based on the key when the key is inserted into the first I/O device component.

25. The system of claim 24, wherein the key comprises an additional functionality feature to be activated for the first I/O device component when the key is physically inserted into the first I/O device component.

26. The system of claim 18, comprising a key configured to be electronically communicated to the first I/O device component, wherein the first and second functionality features are activated or disabled based on the key when the key is electronically communicated to the first I/O device component.

27. The system of claim 18, wherein the identification mechanisms comprise variable resistance values, values stored in a memory, radio frequency identification (RFID) tags, or a combination thereof.

* * * * *